(12) United States Patent
Takewaki et al.

(10) Patent No.: US 11,913,116 B2
(45) Date of Patent: Feb. 27, 2024

(54) SUBSTRATE PROCESSING APPARATUS AND METHOD OF MANUFACTURING SEMICONDUCTOR DEVICE

(71) Applicant: KOKUSAI ELECTRIC CORPORATION, Tokyo (JP)

(72) Inventors: Motoya Takewaki, Toyama (JP); Tomoshi Taniyama, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 783 days.

(21) Appl. No.: 17/028,530

(22) Filed: Sep. 22, 2020

(65) Prior Publication Data
US 2021/0002768 A1  Jan. 7, 2021

Related U.S. Application Data

(63) Continuation of application No. PCT/JP2018/012173, filed on Mar. 26, 2018.

(51) Int. Cl.
*H01L 21/673* (2006.01)
*C23C 16/52* (2006.01)
*C23C 16/458* (2006.01)

(52) U.S. Cl.
CPC .......... *C23C 16/52* (2013.01); *C23C 16/4584* (2013.01); *H01L 21/67303* (2013.01)

(58) Field of Classification Search
CPC ......... H01L 21/67303; H01L 21/67757; H01L 21/67778; H01L 21/67265; H01L 21/67742; H01L 21/67766; H01L 21/68762; C23C 16/52; C23C 16/4584
See application file for complete search history.

(56) References Cited

U.S. PATENT DOCUMENTS

2018/0142353 A1\*  5/2018  Marubayashi .... C23C 16/45578
2018/0179625 A1\*  6/2018  Takagi ............. H01L 21/28562

FOREIGN PATENT DOCUMENTS

| JP | 06-298315 A | 10/1994 |
|---|---|---|
| JP | 07-045548 A | 2/1995 |
| JP | 10-012707 A | 1/1998 |
| JP | 11-067665 A | 3/1999 |
| JP | 2005-175076 A | 6/2005 |
| JP | 2005-217271 A | 8/2005 |
| JP | 2006-257450 A | 9/2006 |
| JP | 2008-028206 A | 2/2008 |

\* cited by examiner

*Primary Examiner* — Kaitlin S Joerger
(74) *Attorney, Agent, or Firm* — Volpe Koenig

(57) ABSTRACT

Described herein is a technique capable of improving a uniformity of a semiconductor manufacturing process by placing a substrate at an appropriate position on the basis of actual installation dimensions of a reaction tube. According to one aspect of the technique, there is provided a substrate processing apparatus including: a boat on which substrates are placed; a process furnace including a reaction tube into which the boat is to be inserted, wherein a film is formed on the substrates placed on the boat in the reaction tube; and a substrate transport device configured to transfer the substrates into the boat, wherein the substrates are transferred into the boat by the substrate transport device referring to a virtual center axis of the reaction tube measured in advance.

11 Claims, 10 Drawing Sheets

<PRIOR ART>

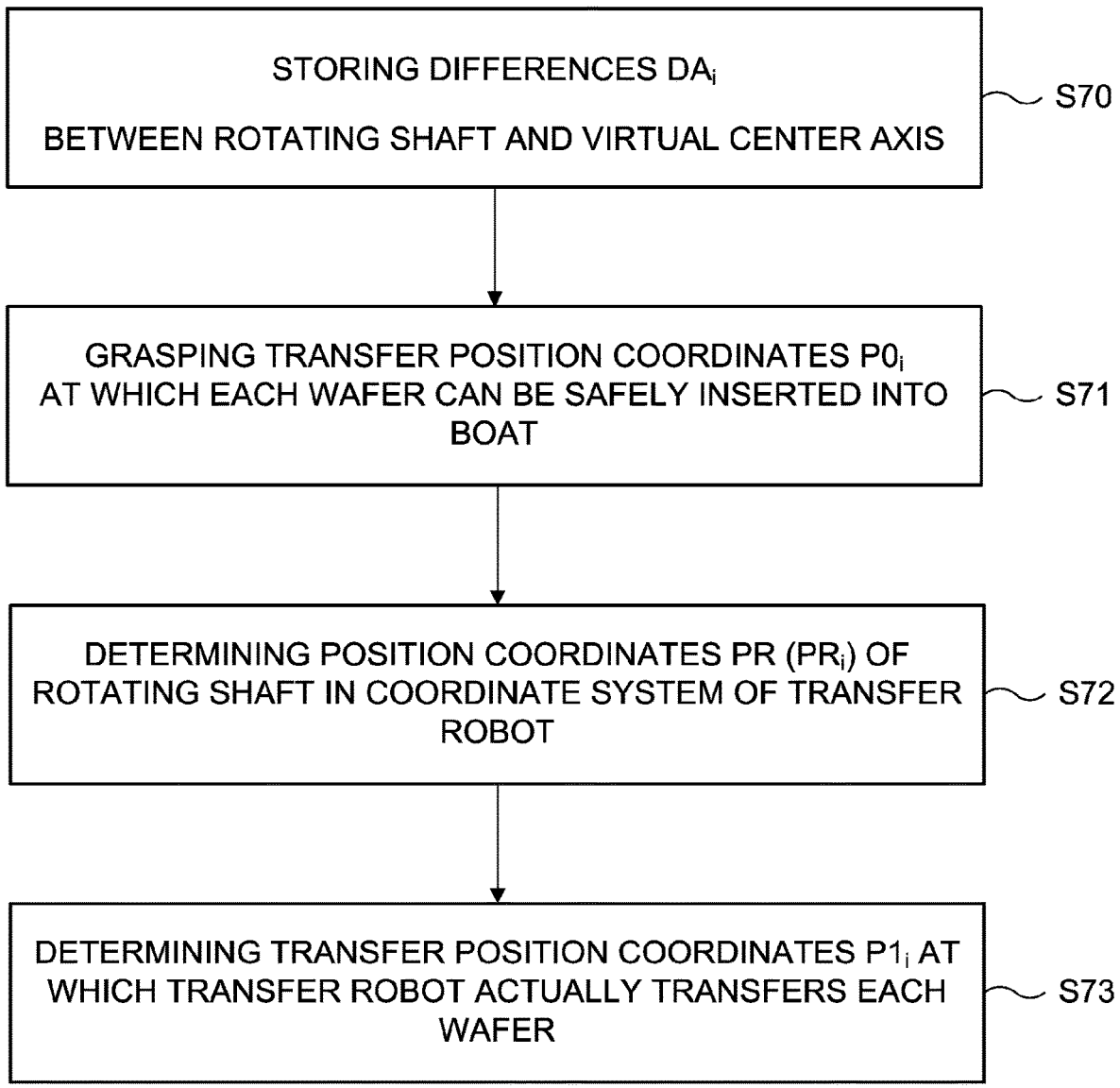

SUBSTRATE PROCESSING APPARATUS AND METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of International Application No. PCT/JP2018/012173, filed on Mar. 26, 2018, in the WIPO, the entire contents of which are hereby incorporated by reference.

BACKGROUND

1. Field

The present disclosure relates to a substrate processing apparatus, in particular, to a substrate processing apparatus of improving a uniformity of a process such as a film-forming process in a vertical type process furnace, and a method of manufacturing a semiconductor device.

2. Description of the Related Art

In a vertical type reaction furnace (also simply referred to as a "process furnace") of a substrate processing apparatus, when forming a film on a substrate (also referred to as a "wafer") a plurality of wafers including the wafer are inserted into a reaction tube of the substrate processing apparatus. Then, a reactive gas is supplied to the plurality of the wafers under predetermined conditions such as a predetermined pressure and a predetermined temperature to form the film. In order to secure a desirable thickness uniformity of the film and a high quality of the film, a temperature uniformity on a surface of the wafer and a temperature uniformity between the plurality of the wafers should be maintained when the plurality of the wafers are heated by a heater, and a uniformity of a gas flow with respect to the plurality of the wafers should be maintained. In recent years, there are some cases where a gap between an edge of the wafer and an inner surface of the reaction tube is maintained as narrow as possible in order to improve a gas replaceability of the reaction tube.

According to some related arts, a teaching technique related to measuring a parameter such as a position and a shape of a boat in order to control a robot configured to transfer the substrate to the boat is disclosed. In order to teach the robot a subtle dimensional difference (also referred to as a "difference between apparatuses") for each substrate processing apparatus or for each boat according to the teaching technique described above, teaching is usually performed only once before operating an apparatus such as the substrate processing apparatus. A case where the teaching about measuring the parameter is performed by the robot itself based on a program may be referred to as an "automatic teaching". However, the related arts described above are silent on which position would be appropriate in transferring the substrate to the boat in the vertical type reaction furnace of the substrate processing apparatus.

According to other related arts, in order to prevent a misalignment between the reaction tube and the boat, there is disclosed a measuring technique that includes attaching a distance measuring jig to a rotating shaft and measuring a distance to an inner surface of a process tube (that is, the reaction tube).

FIG. 1 schematically illustrates a substrate processing apparatus 100. The wafer is transferred to a boat 21 by a wafer transport device (also referred to as a "substrate transport device") 125. In general, the wafer is placed at a position at a center of the boat 21, and after the plurality of the wafers are completely transferred to the boat 21, the boat 21 is inserted into a process furnace 2. Then, a process such as a heat treatment process and a film-forming process is performed to the plurality of the wafers.

Since the gap between the edge of the wafer and the inner surface of the reaction tube provided in the process furnace 2 where the wafer is inserted becomes narrower, an influence of a positional accuracy of the wafer on a uniformity of the film formed on the wafer is increased. However, as a shape of the reaction tube becomes complicated, a manufacturing accuracy may be relaxed. In addition, a thinner column, which is difficult to manufacture, may be used for the boat 21 configured to load (transfer) the wafer into the reaction tube. As a material for the reaction tube and the boat 21, quartz is often used. However, the quartz may be deformed by a heat run or a specific thermal history. Therefore, the wafer aligned with a central axis of the boat 21 may not be aligned with a center axis of the reaction tube. In addition, as another problem, when a gap between the boat 21 and the reaction tube is only about several millimeter (mm), the boat 21 may be brought into contact with the reaction tube for reasons such as a vibration that occurs when the boat 21 is elevated or lowered, it is desired to evaluate a clearance in same environment as in a case where the boat 21 is elevated or lowered.

SUMMARY

Described herein is a technique capable of placing a wafer at an appropriate position based on an actual installation dimension of a component such as a reaction tube and capable of improving a process uniformity.

According to one aspect of the technique of the present disclosure, there is provided a processing apparatus including: a boat on which substrates are placed; a process furnace including a reaction tube into which the boat is to be inserted, wherein a film is formed on the substrates placed on the boat in the reaction tube; and a substrate transport device configured to transfer the substrates into the boat, wherein the substrates are transferred into the boat by the substrate transport device referring to a virtual center axis of the reaction tube measured in advance.

Other problems and novel features of the technique described herein will become apparent from the descriptions of the present specification and the accompanying drawings.

BRIEF DESCRIPTION OF THE DRAWINGS

FIG. 9 is a flowchart for calculating a wafer transfer position preferably used in the embodiments described herein.

DETAILED DESCRIPTION

Hereinafter, one or more embodiments (also simply referred to as "embodiments") according to the technique of the present disclosure will be described with reference to the drawings.

Embodiment

An embodiment will be described with reference to the drawings. According to the present embodiment, a shape measuring apparatus measures a shape of an inner surface of a reaction tube (that is, an inner tube) based on a rotating shaft of a process furnace as a reference axis. Then, an axis of a cylinder is obtained by fitting (i.e., obtaining a geometric approximation based on curve fitting or the like) the shape measured by the shape measuring apparatus onto the cylinder at a height position, wherein the obtained axis of the cylinder is used as a virtual center axis. Then, a transfer robot transfers a wafer into a boat based on, as a reference axis, the virtual center axis of the reaction tube (inner tube) instead of a center axis of the boat. By installing the wafer based on the virtual center axis of the reaction tube, it is expected that a temperature uniformity on a surface of the wafer and a temperature uniformity between a plurality of wafers can be improved when the plurality of the wafers are heated by a heater, and a uniformity of a gas flow with respect to the plurality of wafers can be improved.

A wafer placing position may be determined by measuring a deviation between the rotating shaft and the center axis of the boat by the shape measuring apparatus with the boat loaded in the reaction tube. Since the boat of a vertical type process furnace (also simply referred to as a "process furnace") is rotatable and vertically movable, the shape measuring apparatus may be configured to measure a three-dimensional shape of the reaction tube using such components as the boat. Alternatively, the shape measuring apparatus may be configured to measure the shape of the reaction tube under the vacuum or a high temperature by using a thin and long quartz pipe provided with a mirror at a front end (tip) thereof and inserted into the reaction tube through the rotating shaft.

Figure 1:
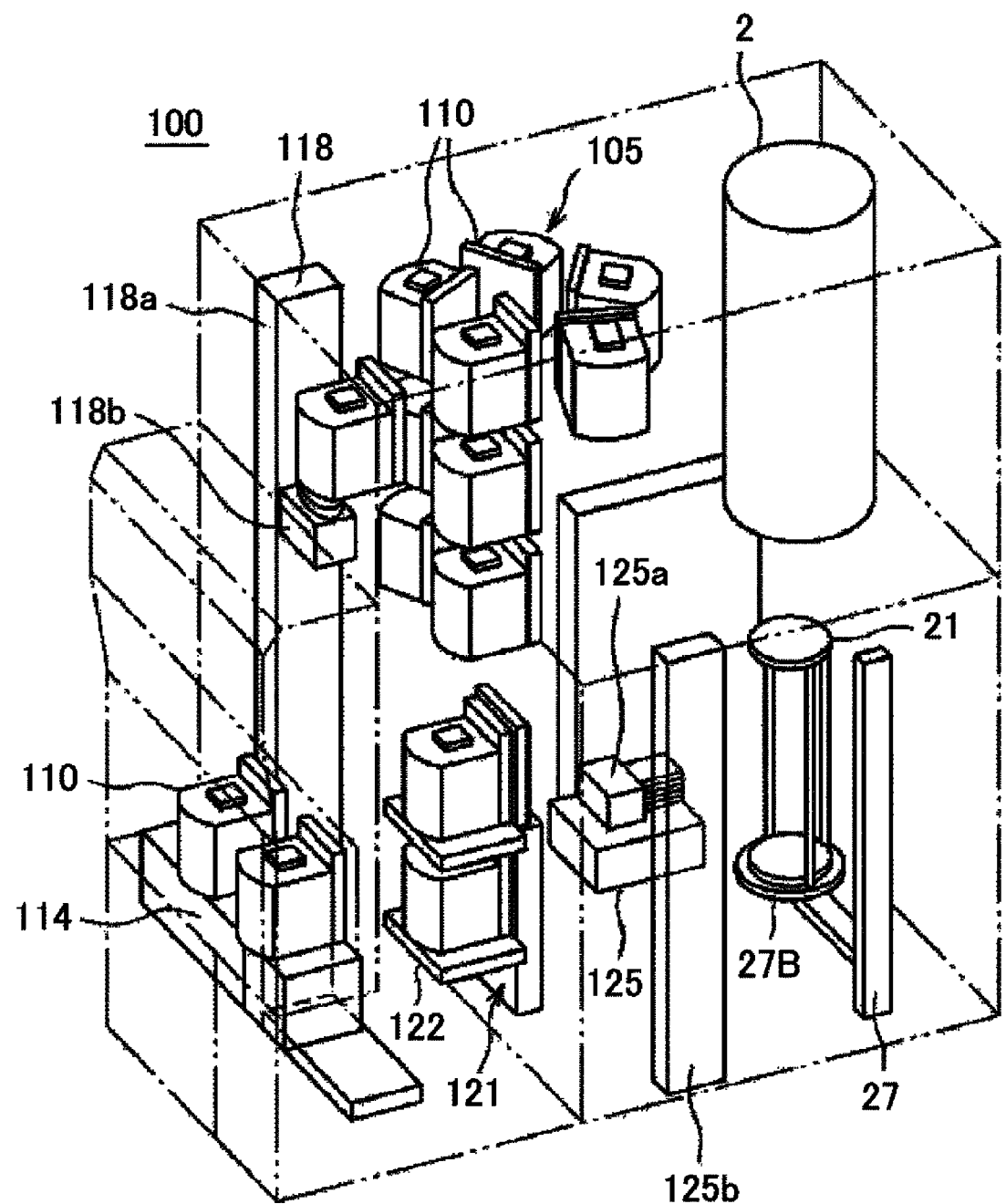
FIG. 1 is a perspective view schematically illustrating a substrate processing apparatus preferably used in one or more embodiments described herein.

FIG. 1 is a perspective view schematically illustrating a semiconductor device manufacturing apparatus (also referred to as a "substrate processing apparatus") 100 preferably used in the present embodiment. The substrate processing apparatus 100 is configured as a vertical type heat treatment apparatus capable of performing a heat treatment process in manufacturing processes of the semiconductor device. For example, the substrate processing apparatus 100 includes: a loading port (also referred to as a "loading port shelf") 114 configured to load and unload a pod 110 serving as a substrate container capable of accommodating wafers (substrates); a pod opener 121 configured to attach or detach a cap of the pod 110; a rotary shelf 105 configured to temporarily store the pod 110; a pod transport device 118 configured to transfer the pod 110; a boat 21 in which the plurality of the wafers are stacked and accommodated; a wafer transport device 125 configured to transfer the wafer between the pod 110 placed on a placing table 122 of the pod opener 121 and the boat 21; a vertical type process furnace (also simply referred to as a "process furnace") 2 including a process chamber 6 (refer to FIG. 2A) and a heater 3 (refer to FIG. 2A); a boat elevator 27 configured to transfer (load) the boat 21 into or transfer (unload) the boat 21 out of the process furnace 2; components of the substrate processing apparatus 100 such as a memory 216; and a controller 29 configured to control the components. In addition, the controller 29 is configured to perform a wafer processing (also referred to as a "substrate processing") such as the heat treatment process based on a process recipe stored in the memory 216.

Figure 2A:
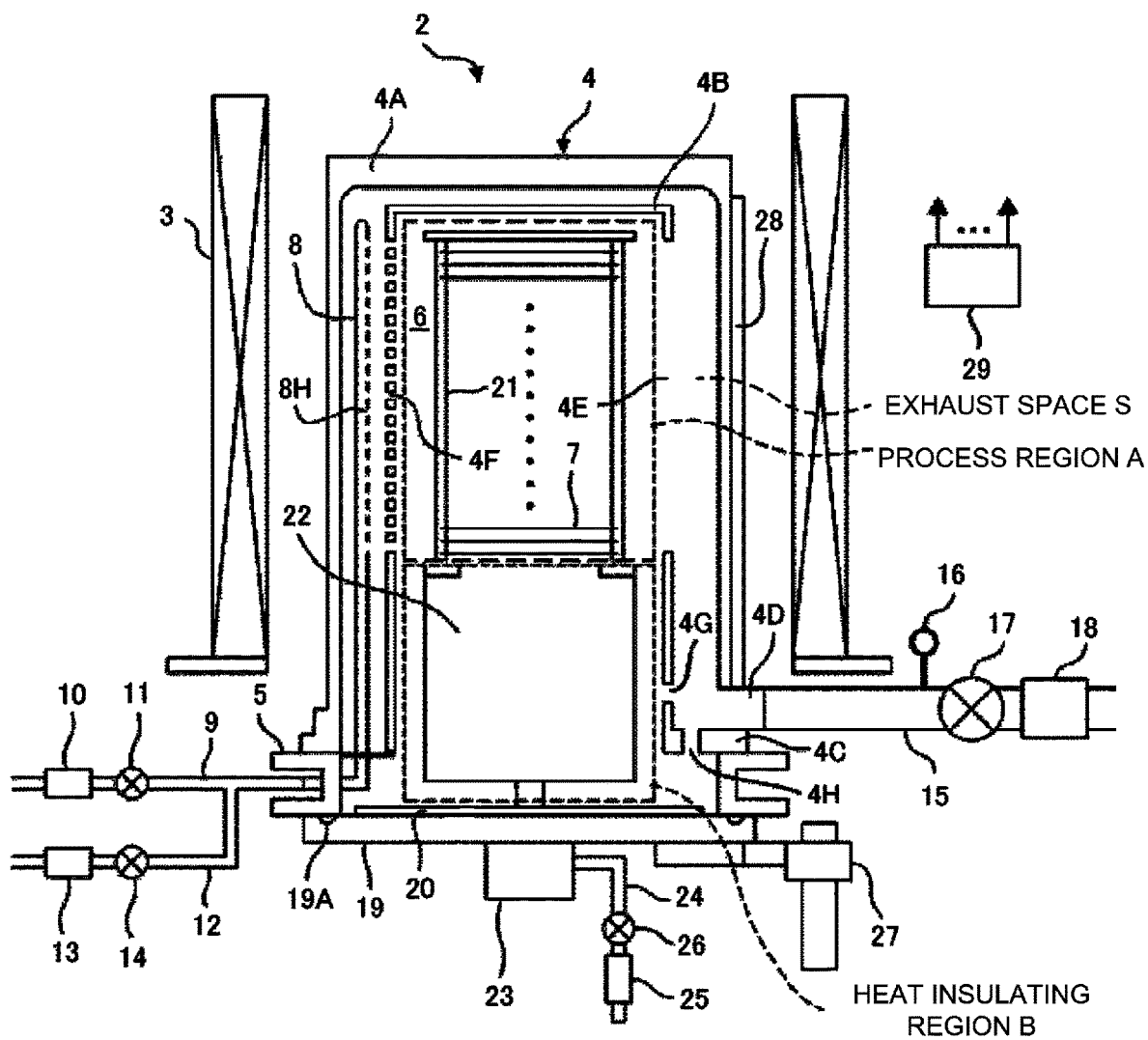
FIG. 2A is a diagram schematically illustrating a process furnace and its periphery preferably used in the embodiments described herein.

FIG. 2A schematically illustrates the vertical type process furnace 2 and its periphery preferably used in the present embodiment. The process furnace 2 includes the heater 3 constituted by a plurality of heater structures in order to uniformly heat the process furnace 2. The heater 3 is of a cylindrical shape, and is vertically installed with respect to an installation floor of the substrate processing apparatus 100 while being supported by a heater base (not shown) serving as a support plate. The heater 3 also functions as an activator (exciter) capable of activating (exciting) a gas such as a process gas by the heat.

A reaction tube 4 is provided on an inner side of the heater 3. A reaction vessel (which is a process vessel) is constituted by the reaction tube 4. For example, the reaction tube 4 is made of a heat resistant material such as quartz ($SiO_2$) and silicon carbide (SiC). The reaction tube 4 is of a cylindrical shape with an open lower end and a closed upper end. The reaction tube 4 is embodied by a double tube structure including an outer tube 4A and an inner tube 4B that are coupled to each other at a flange structure 4C. The flange structure 4C is provided at a lower portion of the reaction tube 4. Upper ends of the outer tube 4A and the inner tube 4B are closed and a lower end of the inner tube 4B is open. The flange structure 4C protrudes outward from an outer periphery of the reaction tube 4. An outer diameter of the flange structure 4C is greater than an outer diameter of the outer tube 4A. An exhaust port 4D communicating with an inside of the outer tube 4A is provided in the vicinity of the lower end of the reaction tube 4. The reaction tube 4 including the above described components such as the outer tube 4A and the inner tube 4B is formed as a single body of a single material. The outer tube 4A is relatively thick so as to withstand a pressure difference when the inside thereof is vacuum exhausted.

A manifold 5 of a cylindrical shape or a truncated cone shape is made of a metal or quartz, and is provided to support the lower end of the reaction tube 4. An inner diameter of the manifold 5 is greater than an inner diameter of the reaction tube 4 (and an inner diameter of the flange structure 4C). Thereby, an annular space described later is defined between the lower end of the reaction tube 4 (that is, the flange structure 4C) and a seal cap 19 described later. The space (the annular space) and/or related components surrounding the space may be collectively referred to as a "furnace opening structure".

The inner tube 4B is provided with a main exhaust port 4E and a plurality of supply slits 4F. The main exhaust port 4E is provided at the inner tube 4B closer to a center of the reaction tube 4 than the exhaust port 4D. The main exhaust port 4E is configured to communicate with an inside and an outside of the inner tube 4B on a side thereof. The plurality of the supply slits 4F are provided at the inner tube 4B at positions opposite to the main exhaust port 4E. The main exhaust port 4E is a single vertically elongated opening that opens to a region where a plurality of wafers including a wafer 7 are disposed. Each of the plurality of the supply slits 4F is a slit extending in a circumferential direction of the inner tube 4B. The plurality of the supply slits 4F are arranged both in the horizontal direction and in the vertical direction so as to correspond to each of the plurality of wafers including the wafer 7.

In addition, the inner tube 4B is provided with a plurality of subsidiary exhaust ports (hereinafter, also referred to as "sub exhaust ports") 4G. The plurality of the sub exhaust ports 4G are provided at the inner tube 4B closer to the center of the reaction tube 4 than the exhaust port 4D and closer to a lower end opening of the reaction tube 4 than the main exhaust port 4E. The plurality of the sub exhaust ports 4G is configured to communicate with the process chamber 6 and an exhaust space S. According to the present embodiment, a space between the outer tube 4A and the inner tube 4B is referred to as the "exhaust space S". The flange structure 4C is also provided with a plurality of bottom exhaust ports 4H. The plurality of the bottom exhaust ports 4H are configured to communicate with the process chamber 6 and a lower end of the exhaust space S. That is, the lower end of the exhaust space S is closed by the flange structure 4C except where the plurality of the bottom exhaust ports 4H and a nozzle introduction hole (not shown) are provided. The plurality of the sub exhaust ports 4G and the plurality of the bottom exhaust ports 4H are configured to mainly exhaust a shaft purge gas described later.

In the exhaust space S, one or more nozzles 8 configured to supply the process gas such as a source gas are provided corresponding to the positions of the plurality of the supply slits 4F. One or more gas supply pipes 9 configured to supply the process gas (the source gas) are connected to the one or more nozzles 8, respectively.

One or more mass flow controllers (MFC) 10 serving as flow rate controllers and one or more valves 11 serving as opening/closing valves are sequentially installed in order on one or more flow paths of the one or more gas supply pipes 9, respectively, from one or more upstream sides to one or more downstream sides of the one or more gas supply pipes 9. One or more gas supply pipes 12 configured to supply an inert gas are connected to the one or more gas supply pipes 9, respectively, at one or more downstream sides of the one or more valves 11. One or more MFCs 13 and one or more valves 14 are sequentially installed in order at the one or more gas supply pipes 12, respectively, from one or more upstream sides to one or more downstream sides of the one or more gas supply pipes 12. A process gas supplier serving as a process gas supply system is constituted mainly by the one or more gas supply pipes 9, the one or more MFCs 10 and the one or more valves 11.

The one or more nozzles 8 are provided in the reaction tube 4 so as to extend straight from a lower portion of the reaction tube 4 to an upper portion of the reaction tube 4. A nozzle hole or a plurality of nozzle holes 8H configured to supply the gas such as the process gas may be provided on one or more upper ends of the one or more nozzles 8 or one or more side surfaces of the one or more nozzles 8. The plurality of the nozzle holes 8H correspond to the openings of the plurality of the supply slits 4F, respectively. The plurality of the nozzle holes 8H are open toward the center of the reaction tube 4. As a result, it is possible to inject (supply) the gas toward the plurality of the wafers including the wafer 7 through the inner tube 4B.

An exhaust pipe 15 configured to exhaust an inner atmosphere of the process chamber 6 is connected to the exhaust port 4D. A vacuum pump 18 serving as a vacuum exhaust apparatus is connected to the exhaust pipe 15 through a pressure sensor 16 and an APC (Automatic Pressure Controller) valve 17. The pressure sensor 16 serves as a pressure detector (which is a pressure meter) to detect an inner pressure of the process chamber 6, and the APC valve 17 serves as a pressure controller (which is a pressure regulator). With the vacuum pump 18 in operation, the APC valve 17 may be opened or closed to exhaust (vacuum-exhaust) the process chamber 6 or stop the vacuum exhaust. With the vacuum pump 18 in operation, an opening degree of the APC valve 17 may be adjusted based on pressure information detected by the pressure sensor 16, in order to control (adjust) the inner pressure of the process chamber 6. An exhaust system is constituted mainly by the exhaust pipe 15, the APC valve 17 and the pressure sensor 16. The exhaust system may further include the vacuum pump 18.

The seal cap 19 serving as a furnace opening lid capable of airtightly sealing a lower end opening of the manifold 5 is provided under the manifold 5. The seal cap 19 is made of a metal such as stainless steel and a nickel-based alloy, and is of a disk shape. An O-ring 19A serving as a seal is provided on an upper surface of the seal cap 19 so as to be in contact with the lower end of the manifold 5.

A cover plate 20 is provided on the upper surface of the seal cap 19 so as to protect a portion of the seal cap 19 inner than an inner periphery of the lower end of the manifold 5. The cover plate 20 is made of a heat and corrosion resistant material such as quartz, sapphire and SiC, and is of a disk shape. Since the cover plate 20 does not require much mechanical strength, the cover plate 20 may be formed with a small thickness. In addition, according to the present embodiment, the cover plate 20 does not have to be prepared independently of the seal cap 19. For example, the cover plate 20 may be embodied by a film or a layer such as a nitride film coated on an inner surface of the seal cap 19 or a nitride film formed by modifying the inner surface of the seal cap 19. The cover plate 20 may further include a wall extending along an inner surface of the manifold 5 from a circumferential edge of the cover plate 20.

The boat 21 serving as a substrate retainer is configured to align the plurality of the wafers including the wafer 7 (for example, from 25 to 200 wafers) in the vertical direction and configured to support the plurality of the wafers in a multistage manner, while the plurality of the wafers are horizontally oriented with their centers aligned with each other. That is, the boat 21 supports (accommodates) the plurality of the wafers including the wafer 7 with predetermined intervals therebetween. The boat 21 is made of a heat resistant material such as quartz and SiC. It is preferable to set a minimum inner diameter of the reaction tube 4 such that the boat 21 can be safely loaded (transferred) into the reaction tube 4 and unloaded (transferred) out of the reaction tube 4.

A heat insulating assembly 22 is disposed (provided) below the boat 21. The heat insulating assembly 22 is embodied by a structure in which conduction or transmission of the heat tends to reduce in the vertical direction, and usually a cavity is provided in the heat insulating assembly 22. It is possible to purge an inside of the heat insulating assembly 22 with the shaft purge gas. The upper portion of the reaction tube 4 where the boat 21 is disposed may be referred to as a "substrate processing region A", and the lower portion of the reaction tube 4 where the heat insulating assembly 22 is disposed may be referred to as a "heat insulating region B". The substrate processing region A may also be simply referred to as a "process region A".

A rotator 23 serving as a rotating mechanism and configured to rotate the boat 21 is provided under the seal cap 19 opposite to the process chamber 6. A gas supply pipe 24 of the shaft purge gas is connected to the rotator 23. An MFC 25 and a valve 26 are installed at the gas supply pipe 24 sequentially in order from an upstream side to a downstream side of the gas supply pipe 24. This purge gas (that is, the shaft purge gas) is to protect an inside of the rotator 23 (for example, bearings) from the gas such as a corrosive gas used in the process chamber 6. The purge gas is discharged (exhausted) from the rotator 23 along a shaft of the rotator 23 and is guided into the heat insulating assembly 22.

The boat elevator 27 is provided outside the reaction tube 4 vertically below the reaction tube 4. The boat elevator 27 serves as an elevator (which is a transfer device) capable of elevating and lowering the seal cap 19. When the seal cap 19 is moved upward or downward by the boat elevator 27, the boat 21 placed on the seal cap 19 and the plurality of the wafers including the wafer 7 accommodated in the boat 21 may be transferred into and out of the process chamber 6. There may be provided a shutter (not shown) configured to close the lower end opening of the manifold 5 instead of the seal cap 19 while the seal cap 19 is being lowered to a lowest position thereof.

A temperature detector 28 is installed on an outer wall of the outer tube 4A. The temperature detector 28 may be embodied by a plurality of thermocouples arranged in a vertical array. The state of electric conduction to the heater 3 may be adjusted based on temperature information detected by the temperature detector 28 such that a desired temperature distribution of the inner temperature of the process chamber 6 is obtained.

The controller 29 is constituted by a computer configured to control the entire substrate processing apparatus 100. A configuration of the controller 29 will be described later.

Figure 2B:
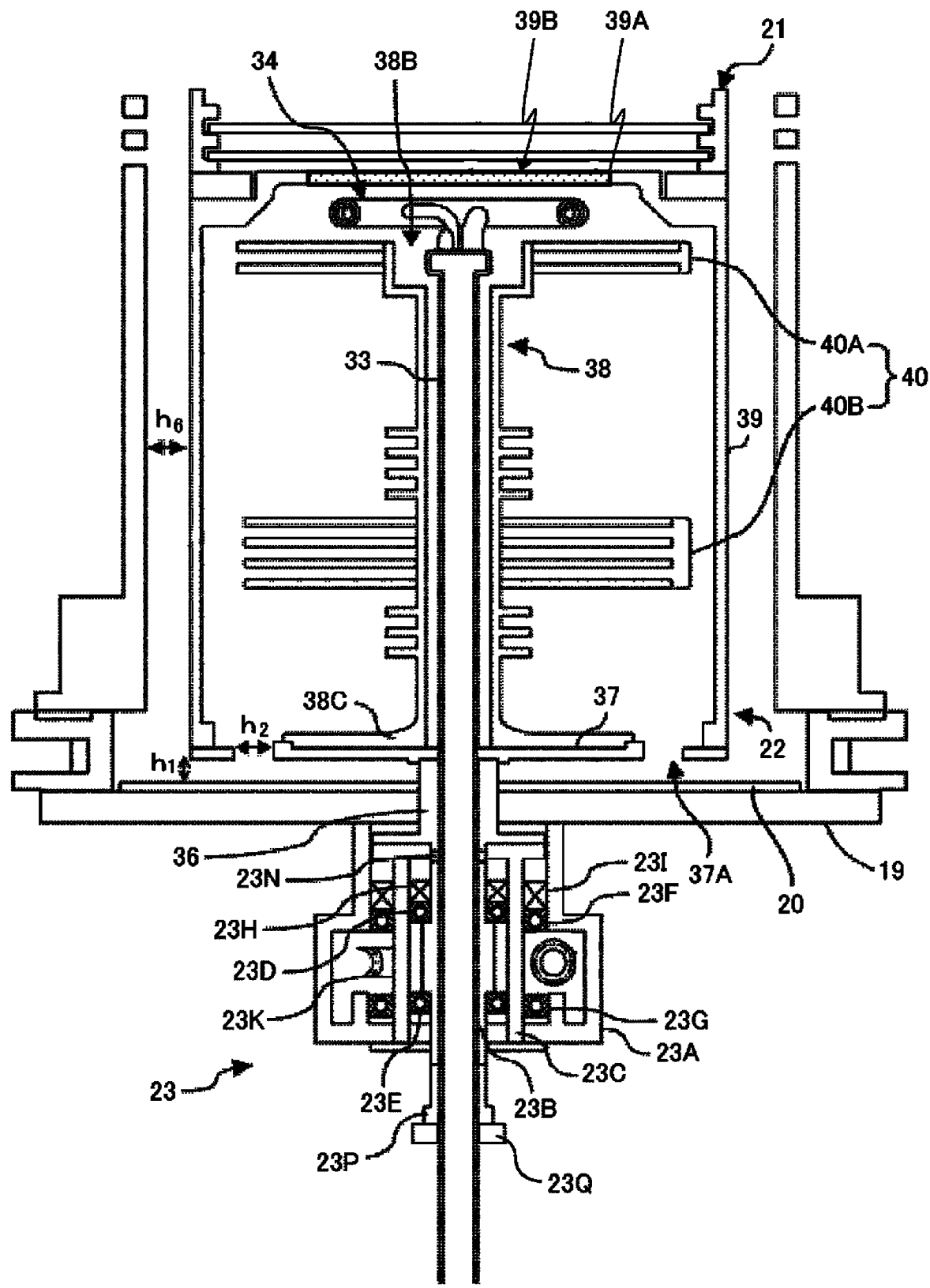
FIG. 2B is a diagram schematically illustrating a cross-section of a heat insulating assembly and a rotator preferably used in the embodiments described herein.

FIG. 2B schematically illustrates a cross-section of the heat insulating assembly 22 and the rotator 23 preferably used in the present embodiment. The rotator 23 includes a casing (which is a body) 23A. The casing 23A is of a substantially cylindrical shape with an open upper end and a closed lower end. The casing 23A is fixed to a lower surface of the seal cap 19 with a bolt. From an inside of the casing 23A, an inner shaft 23B of a cylindrical shape and an outer shaft 23C of a cylindrical shape are arranged in this order coaxially in the casing 23A. A diameter of the outer shaft 23C is greater than that of the inner shaft 23B. In addition, the outer shaft 23C may be rotatably supported by a pair of inner bearings 23D and 23E interposed (provided) between the outer shaft 23C and the inner shaft 23B and a pair of outer bearings 23F and 23G interposed between the outer shaft 23C and the casing 23A. The inner bearings 23D and 23E constitute a vertically arranged pair, and the outer bearings 23F and 23G constitute another vertically arranged pair. The inner shaft 23B is fixed to the casing 23A so that it cannot rotate.

Magnetic fluid seals 23H and 23I are provided above the outer bearing 23F (that is, provided at a side of the outer bearing 23F facing the process chamber 6) and the inner bearing 23D to separate the vacuum atmosphere and the air of atmospheric pressure. A worm wheel or a pulley 23K that is driven by a component such as an electric motor (not shown) is mounted (provided) at the outer shaft 23C.

A sub heater support column 33 is vertically inserted inside the inner shaft 23B. The sub heater support column 33 serves as a first auxiliary heating apparatus configured to heat the wafer 7 from thereunder in the process chamber 6. For example, the sub heater support column 33 is a quartz pipe configured to support a cap heater 34 concentrically at an upper end thereof. The sub heater support column 33 is supported by a support 23N made of a heat resistant resin at an upper end position of the inner shaft 23B. A portion between the sub heater support column 33 and the inner shaft 23B is sealed by a vacuum joint 23P at a lower portion of the sub heater support column 33. In addition, a fixing block 23Q is provided at the lower portion of the sub heater support column 33 so as to fix the inner shaft 23B to the seal cap 19 so that the inner shaft 23B cannot rotate with respect to the seal cap 19.

A rotating shaft body 36 of a cylindrical shape is fixed to an upper surface of the outer shaft 23C of a flange shape. The rotating shaft body 36 includes a flange (not shown) at a lower end thereof. The sub heater support column 33 penetrates a cavity (opening) of the rotating shaft body 36. The cavity of the rotating shaft body 36 is configured to communicate with an inside and an outside of the reaction tube 4, and is provided coaxially with a rotation axis of the rotating shaft body 36. At an upper end of the rotating shaft body 36, a rotating table 37 of a disk shape is fixed to the cover plate 20 with a predetermined gap h1 therebetween. A through-hole through which the sub heater support column 33 penetrates is provided at a center of the rotating table 37.

A heat insulator retainer 38 configured to support (hold) a heat insulator 40 and a cylinder structure 39 are placed concentrically on an upper surface of the rotating table 37, and fixed by components such as screws. The heat insulating assembly 22 is constituted by the rotating table 37, the heat insulator retainer 38, the cylinder structure 39 and the heat insulator 40. The rotating table 37 serves as a bottom plate (that is, a support plate). A plurality of exhaust holes 37A with a diameter (width) h2 are provided at the rotating table 37 in a rotationally symmetrical arrangement in the vicinity of an edge of the rotating table 37.

The heat insulator retainer 38 is of a cylindrical shape. A cavity through which the sub heater support column 33 penetrates is provided at a center of the heat insulator retainer 38. The heat insulator retainer 38 is provided with a pedestal 38C of an outward extending flange shape at a lower end of the heat insulator retainer 38. An outer diameter of the pedestal 38C is smaller than a diameter of the rotating table 37. An upper end of the heat insulator retainer 38 is configured as a supply port 38B of the purge gas. An upper end portion of the heat insulator retainer 38 (that is, the supply port 38B) expands in diameter so as to accommodate the sub heater support column 33 protruding outward in the vicinity of the upper end portion of the heat insulator retainer 38 (that is, the supply port 38B).

A flow path, whose cross-section is of an annular shape, configured to supply the shaft purge gas upward in the heat insulating assembly 22 is provided between the heat insulator retainer 38 and the sub heater support column 33. The purge gas (that is, the shaft purge gas) supplied through the supply port 38B flows downward in a space between the heat insulator retainer 38 and an inner wall of the cylinder structure 39, and is exhausted through the plurality of the exhaust holes 37A to the outside of the cylinder structure 39. The shaft purge gas exhausted through the plurality of the exhaust holes 37A flows in a radial direction through a gap between the rotating table 37 and the cover plate 20, and is discharged to the furnace opening structure. Thereby, the furnace opening structure is purged.

A plurality of reflecting plates 40A and a plurality of heat insulating plates 40B serving as the heat insulator 40 are coaxially arranged on a column of the heat insulator retainer 38.

An outer diameter of the cylinder structure 39 is set such that a gap h6 between the inner tube 4B and the cylinder structure 39 becomes equal to a predetermined distance. It is preferable that the gap h6 is narrow in order to suppress the process gas and the shaft purge gas from passing therethrough. For example, the gap h6 preferably ranges from 7.5 mm to 15 mm.

An upper end of the cylinder structure 39 is closed by a flat plate, and the boat 21 is installed on the flat plate. In addition, an opening 39A is provided at a center of an upper surface of the cylinder structure 39 in order to remove the sub heater support column 33 or the cap heater 34 or in order to penetrate the shape measuring apparatus when measuring the shape of the reaction tube 4, as described later. The opening 39A is closed by a lid 39B that fits the opening 39A except when the shape of the inner tube 4B is measured by the shape measuring apparatus. When the shape of the inner tube 4B is measured, it is assumed that an outer portion of the upper surface of the cylinder structure 39 is flat without any step thereon.

Figure 3:
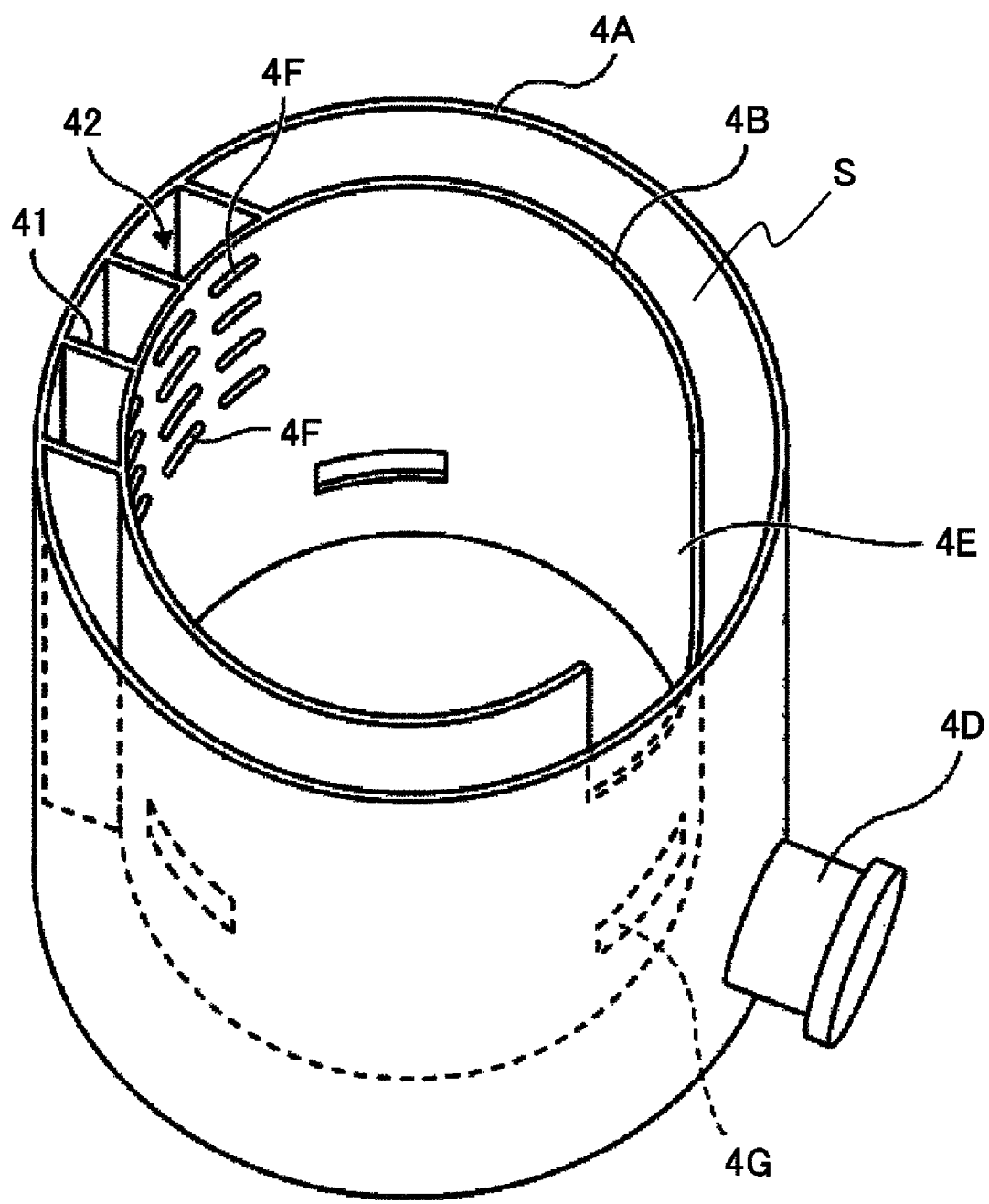
FIG. 3 is a perspective view schematically illustrating a cross-section of a reaction tube preferably used in the embodiments described herein.

FIG. 3 is a perspective view schematically illustrating a horizontal cross-section of the reaction tube 4 preferably used in the present embodiment. In FIG. 3, the illustration of the flange structure 4C is omitted for convenience. The plurality of the supply slits 4F configured to supply the process gas into the process chamber 6 are provided in the inner tube 4B. The plurality of the supply slits 4F are arranged in a lattice pattern. That is, for example, the number of the plurality of the supply slits 4F counted along the vertical direction (that is, the number of columns of the lattice pattern) is the same as the number of the plurality of the wafers including the wafer 7, and the number of the plurality of the supply slits 4F counted along the horizontal direction (that is, the number of rows of the lattice pattern) is three. A plurality of partition plates 41 extending in the vertical direction are provided so as to partition the exhaust space S between the outer tube 4A and the inner tube 4B. The plurality of the partition plates 41 are arranged circumferentially between the plurality of the supply slits 4F or at both the ends of the plurality of the supply slits 4F. Sections separated from the exhaust space S by the plurality of the partition plates 41 constitute a plurality of nozzle chambers (which is nozzle buffers) 42. It is only the plurality of the supply slits 4F that directly connect the plurality of the nozzle chambers 42 with the inside of the inner tube 4B.

The plurality of the partition plates 41 are connected to the inner tube 4B. However, in order to avoid the stress caused by a temperature difference between the outer tube 4A and the inner tube 4B, the plurality of the partition plates 41 may not be directly connected to the outer tube 4A, and a slight gap may be provided between the plurality of the partition plates 41 and the outer tube 4A. The plurality of the nozzle chambers 42 may not be completely isolated from the exhaust space S. One or more openings or gaps communicating with the exhaust space S and the plurality of the nozzle chambers 42 may be provided at the plurality of the nozzle chambers 42, particularly, at upper ends and lower ends of the plurality of the nozzle chambers 42. Outer peripheral sides of the plurality of the nozzle chambers 42 may be partitioned by the outer tube 4A. However, the configuration of the plurality of the nozzle chambers 42 is not limited thereto. For example, a partition plate extending along an inner surface of the outer tube 4A may be separately provided to constitute an outer boundary of the nozzle chambers 42.

In the inner tube 4B, the plurality of the sub exhaust ports (for example, three sub exhaust ports) 4G are provided at such positions as to open toward a side surface of the heat insulating assembly 22. One of the three sub exhaust ports 4G is oriented in the same direction as the exhaust port 4D, and is disposed at a height such that at least a part of an opening thereof overlaps a pipe of the exhaust port 4D. In addition, the remaining two sub exhaust ports 4G are arranged in the vicinity of both side portions of the plurality of the nozzle chambers 42. Alternatively, the three sub exhaust ports 4G may be arranged at positions that are spaced apart by 180 degrees on a circumference of the inner tube 4B.

Figure 4:
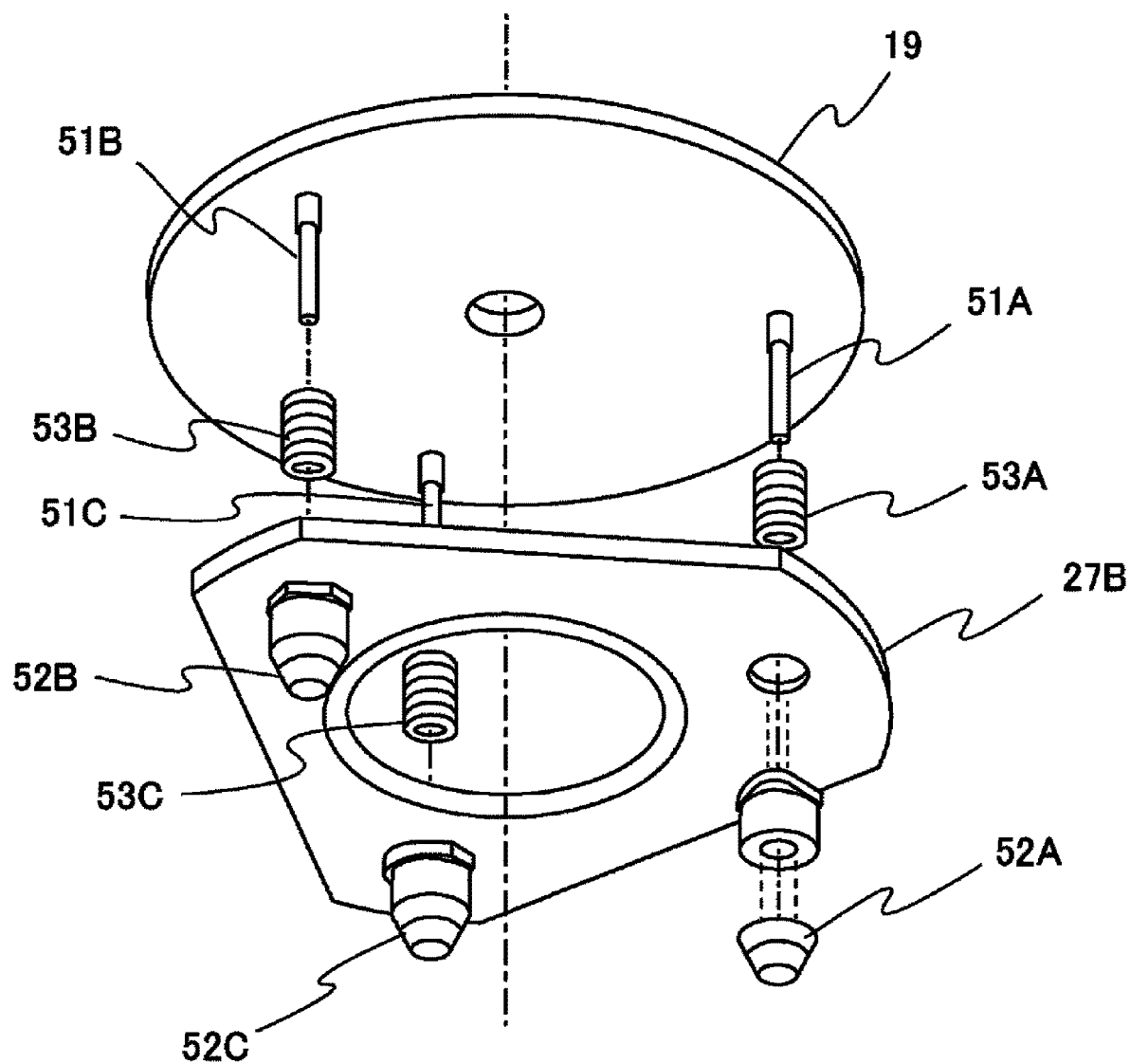
FIG. 4 is a diagram schematically illustrating a supporting structure of carrying a seal cap by a boat elevator preferably used in the embodiments described herein.

A supporting structure of carrying the seal cap 19 by the boat elevator 27 will be described with reference to FIG. 4. Three shafts 51A through 51C of linear bushes (linear guides) are provided at the seal cap 19 so as to protrude vertically from the lower surface of the seal cap 19. On the other hand, the boat elevator 27 includes a flat support plate 27B on an arm of the boat elevator 27, and three linear bushes 52A through 52C that engage with the seal cap 19 are provided at the support plate 27B. In addition, three elastic bodies 53A through 53C such as coil springs are provided between the support plate 27B and the seal cap 19. When the shafts 51A through 51C are fitted into the linear bushes 52A through 52C, respectively, the seal cap 19 is supported in a manner that only a vertical movement is possible (uniaxial degree of freedom) with respect to the arm of the boat elevator 27 and the support plate 27B. The arm of the boat elevator 27 and the support plate 27B may be integrally formed (that is, formed as a single body) by using a method such as casting. In addition, the rigidity of arm of the boat elevator 27 or the rigidity of the support plate 27B is sufficiently set so that the arm of the boat elevator 27 and the support plate 27B are not bent by a load such as that of the boat 21 or a pressure applied through the manifold 5, or the center axis of the boat 21 does not tilt or swing from the vertical axis. An X-Y fine movement stage may be provided between the linear bushes 52A through 52C and the support plate 27B so that a horizontal position of the shaft can be adjusted. Alternatively, a horizontal position at which the reaction tube 4 is installed on the manifold 5 may be adjusted by using components such as a bolt.

Figure 5:
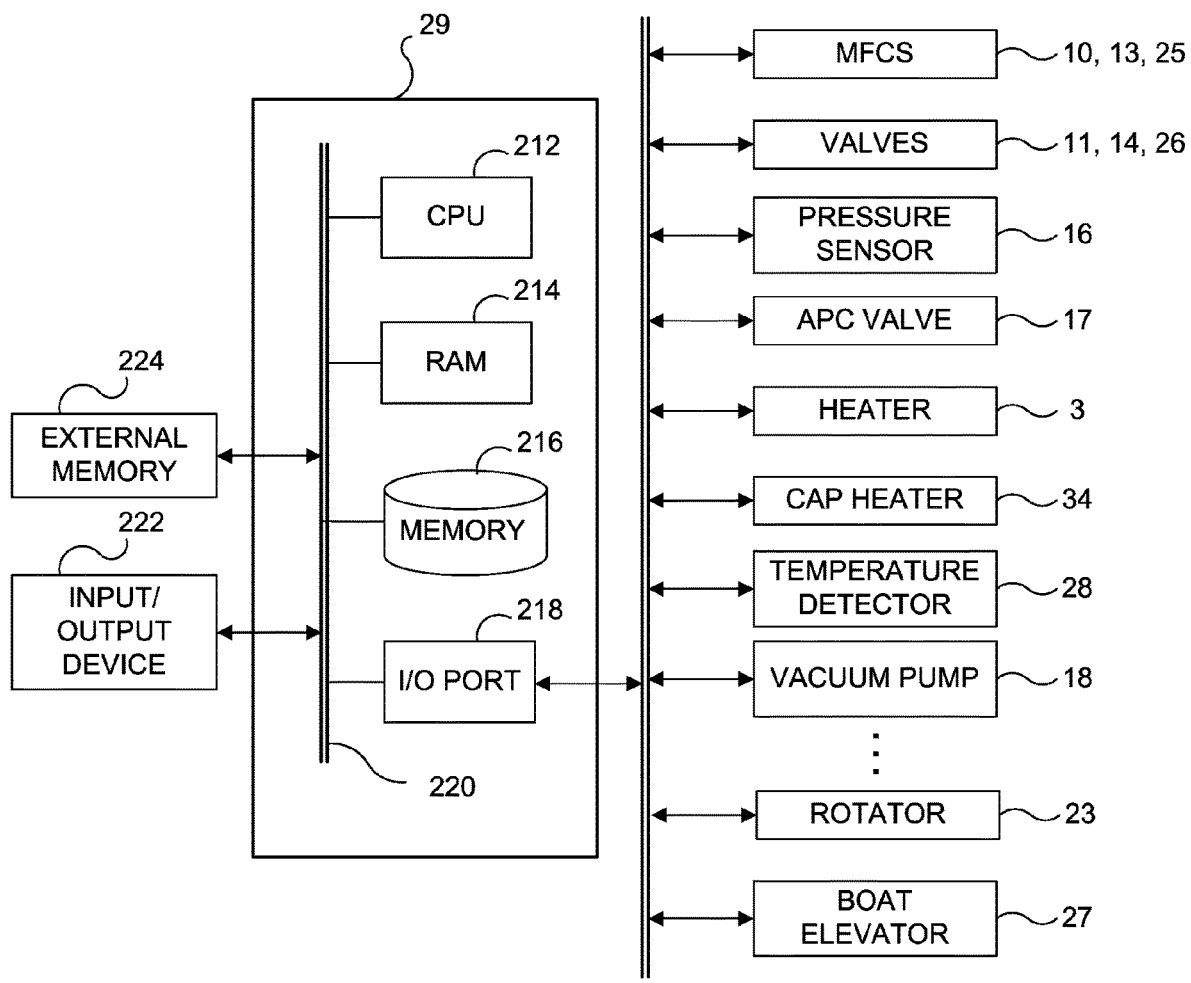
FIG. 5 is a diagram schematically illustrating a configuration of a controller preferably used in the embodiments described herein.

As shown in FIG. 5, the controller 29 is electrically connected to the components of the substrate processing apparatus 100 such as the MFCs 10, 13 and 25, the valves 11, 14 and 26, the pressure sensor 16, the APC valve 17, the vacuum pump 18, the heater 3, the cap heater 34, the temperature detector 28, the rotator 23 and the boat elevator 27, and is configured to control the components electrically connected thereto. The controller 29 may be constituted by a computer including a CPU (Central Processing Unit) 212, a RAM (Random Access Memory) 214, a memory 216 and an I/O port 218. The RAM 214, the memory 216 and the I/O port 218 may exchange data with the CPU 212 through an internal bus 220. The I/O port 218 is connected to the components described above. For example, an input/output device 222 such as a touch panel is connected to the controller 29.

The memory 216 is configured by components such as a flash memory and a hard disk drive (HDD). For example, a control program for controlling the operation of the substrate processing apparatus 100 or a program (for example, a recipe such as a process recipe and a cleaning recipe) configured to control the components of the substrate processing apparatus 100 according to the process conditions to perform the substrate processing such as a film-forming process is readably stored in the memory 216. The RAM 214 functions as a memory area (work area) where a program or data read by the CPU 212 is temporarily stored.

The CPU 212 is configured to read the control program from the memory 216 and execute the read control program. In addition, the CPU 212 is configured to read the recipe from the memory 216 according to an operation command inputted from the input/output device 222. According to the contents of the read recipe, the CPU 212 is configured to control the components of the substrate processing apparatus 100.

The controller 29 may be embodied by installing the above-described program stored in an external memory 224 in a non-transitory manner into a computer. For example, the external memory 224 may include a semiconductor memory such as a USB memory and a memory card, an optical disk such as a CD and a DVD and a hard disk drive (HDD). The memory 216 or the external memory 224 may be embodied by a non-transitory tangible computer readable recording medium. Hereafter, the memory 216 and the external memory 224 may be collectively referred to as "recording media". Instead of the external memory 224, a communication means such as the Internet and a dedicated line may be used for providing the program to the computer.

Figure 6:
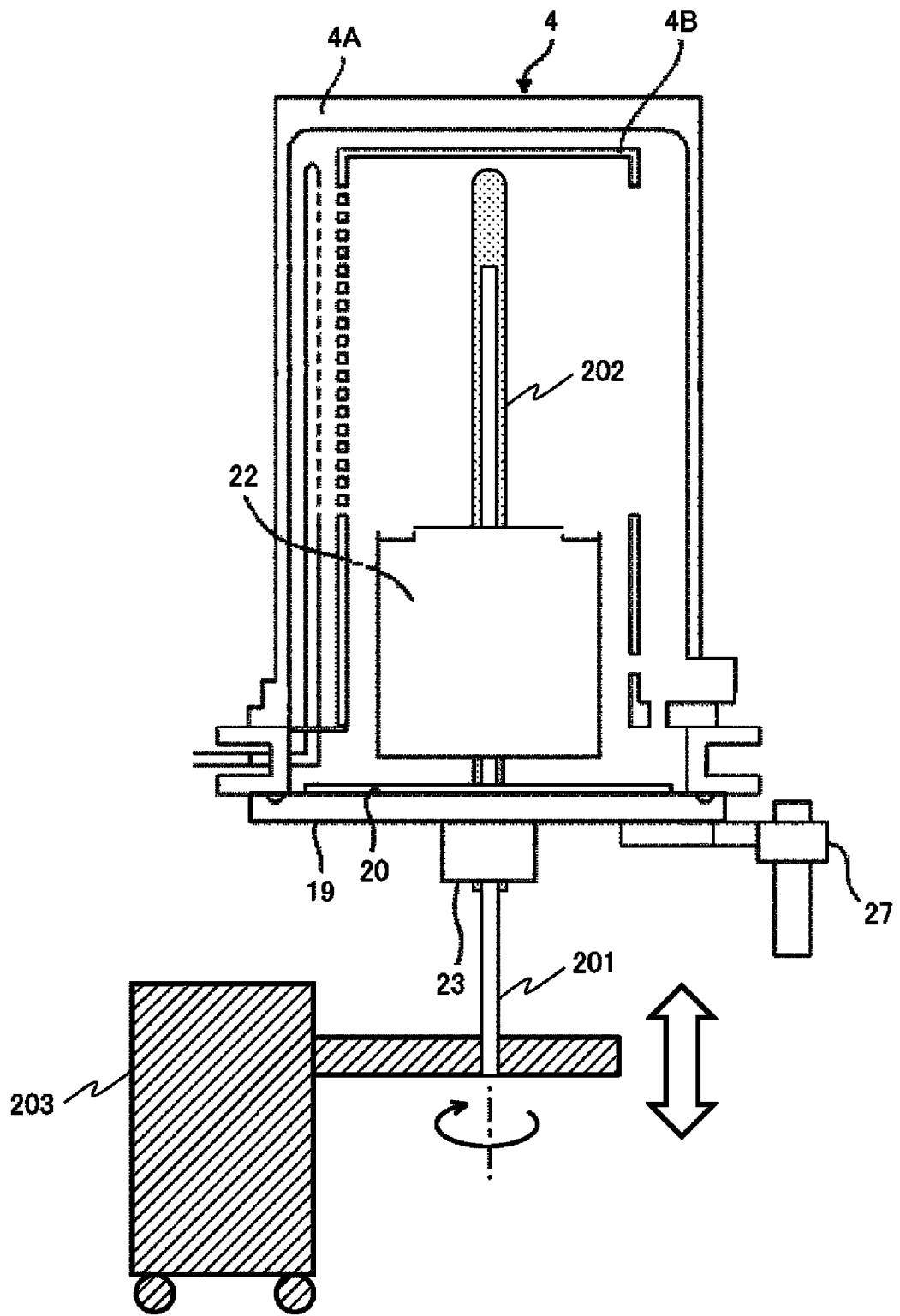
FIG. 6 is a diagram schematically illustrating a configuration example of a shape measuring apparatus configured to measure a shape of the reaction tube preferably used in the embodiments described herein.

FIG. 6 schematically illustrates the shape measuring apparatus configured to measure the shape of the reaction tube 4 (that is, the inner tube 4B) preferably used in the present embodiment. The shape measuring apparatus includes: a sensor structure 201 configured to irradiate a laser beam to measure a change in the distance; a sheath tube 202 of the sensor structure 201; an automatic profiler 203 configured to drive the sensor structure 201 and to collect a length measurement result; and a calculator (which is a computer, not shown) configured to perform an arithmetic processing on the length measurement result collected by the automatic profiler 203.

The sheath tube 202 may be of a column shape. The sheath tube 202 may be constituted by a quartz cylindrical tube whose one end is closed in a hemispherical shape and whose other end is open. The sheath tube 202 is of a highly accurate cylindrical shape and is linearly elongated. In the vicinity of the open end of the sheath tube 202, an outer diameter of the sheath tube 202 is set such that the sheath tube 202 is inserted into a center hole (opening) of the inner shaft 23B in a manner of clearance fit with a predetermined tolerance, and an outer diameter of the sheath tube 202 at other portions of the sheath tube 202 is slightly smaller that of the sheath tube 202 in the vicinity of the open end.

Figure 7:
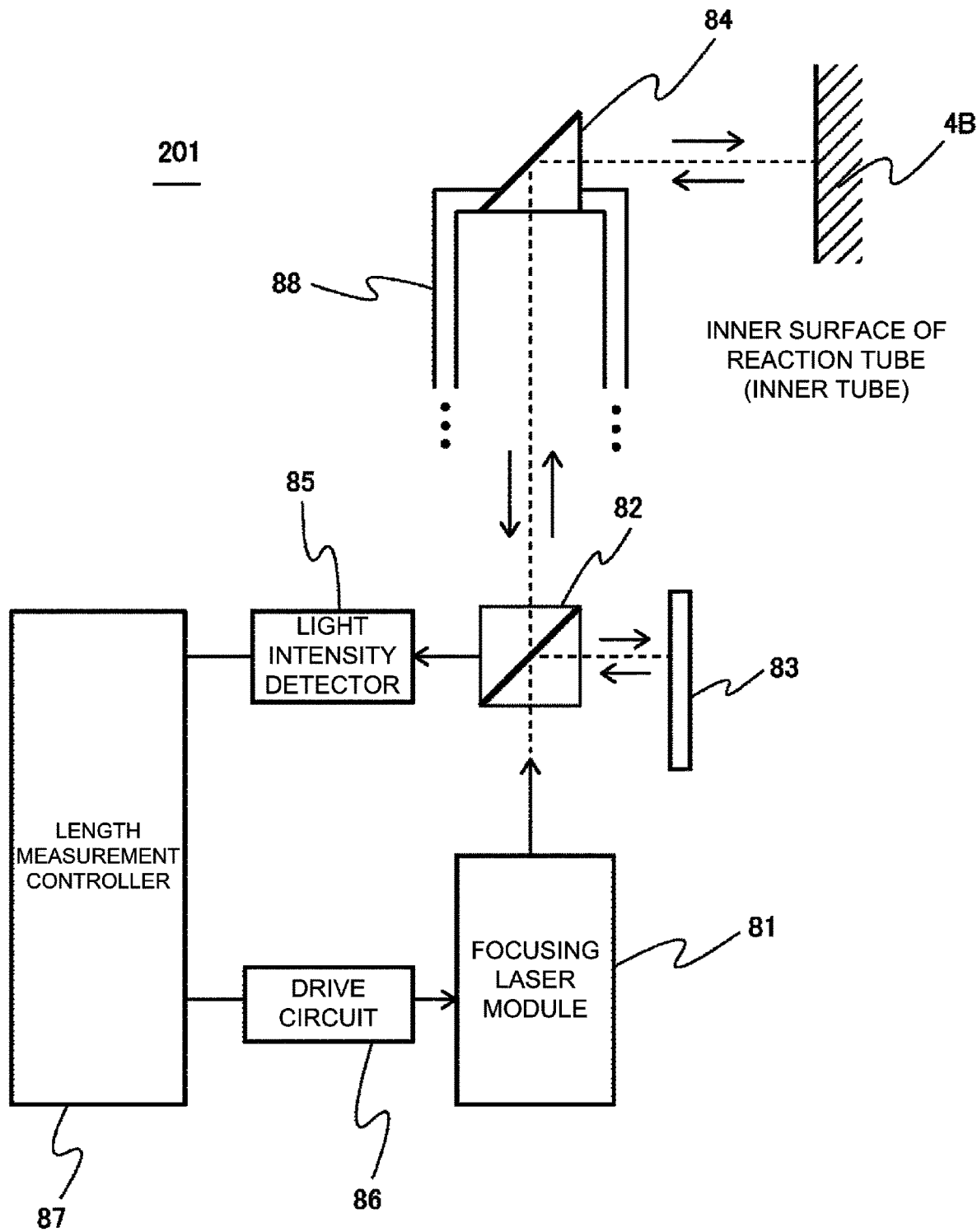
FIG. 7 is a diagram schematically illustrating a configuration example of a sensor structure 201 preferably used in the embodiments described herein.

FIG. 7 schematically illustrates a configuration example of the sensor structure 201 preferably used in the present embodiment. The sensor structure 201 includes: a focusing laser module 81; a beam splitter (which is a half mirror) 82; a reference mirror 83; a 45° rod mirror 84; a light intensity detector 85; a drive circuit 86; a length measurement controller 87; and a sensor structure case 88. The sensor structure 201 constitutes a phase difference type (interference type) range finder. The sensor structure case 88 may be constituted by a rigid fixing tool that rigidly fixes the configurations from the focusing laser module 81 to the light intensity detector 85 or may be constituted by a flexible pipe-shaped case that connects the configurations in a manner that an optical path length thereof remains unchanged. The sensor structure case 88 is configured so that it can be inserted into the sheath tube 202. Alternatively, it is sufficient as long as at least the 45° rod mirror 84 can be inserted into the sheath tube 202, and a front end portion (tip portion) of the sensor structure case 88 supports (holds) the 45° rod mirror 84 such that only vertical and rotational movements are possible for the 45° rod mirror 84 due to the clearance fit between the sensor structure case 88 and an inner surface of the sheath tube 202. Alternatively, a diameter of the entire sensor structure 201 may be set such that the entire sensor structure 201 can be inserted into the sheath tube 202.

The focusing laser module 81 emits a collimated light of an appropriate coherence. Although an inner surface of the inner tube 4B is not a perfect mirror surface, a smoothness of the inner surface of the inner tube 4B is set such that a reflected light remains coherent. The drive circuit 86 applies the electric energy to a laser oscillator of the focusing laser module 81 to excite the light. By changing a driving current (or a driving voltage), it is possible to modulate an intensity or a wavelength of the light emitted from the focusing laser module 81. The beam splitter (half mirror) 82 and the reference mirror 83 constitute an interferometer. The 45° rod mirror 84 bends a direction of an irradiation light from the beam splitter (half mirror) 82 to a measurement target (that is, the inner surface of the inner tube 4B) and a reflected light from the inner surface of the inner tube 4B by 90 degrees. The light intensity detector 85 detects a phase difference between the irradiation light and the reflected light from the inner surface of the inner tube 4B based on a change in the light intensity due to the interference between the irradiation light and the reflected light. The length measurement controller 87 analyzes an output of the light intensity detector 85 while changing a frequency of the emitted light from the focusing laser module 81 by a FMCW or an amplitude modulation, and calculates the distance. When the FMCW is used, the absolute distance of each reflection path is uniquely determined by a frequency spectrum of the output of the light intensity detector 85. In addition, optical combs may be used for the emitted light. When an entire inner circumference of the inner tube 4B is smooth, an interference fringe counting type apparatus capable of calculating the change in the distance may be used as the length measurement controller 87.

When setting up the shape measuring apparatus, the sub heater support column 33 and the cap heater 34 are removed from the process furnace 2, the boat elevator 27 is stopped at a loading position, and the sheath tube 202 is installed at the rotator 23 instead of the sub heater support column 33. Specifically, similar to the sub heater support column 33, the sheath tube 202 is fixed to the inner shaft 23B by the support 23N, the vacuum joint 23P and the fixing block 23Q. When the sheath tube 202 is fixed to the inner shaft 23B, the sensor structure 201 is inserted thereinto, and the sensor structure 201 is further fixed to the automatic profiler 203.

When a setup of the shape measuring apparatus is completed, the automatic profiler 203 executes a measuring program. The measuring program is configured to perform an operation of elevating or lowering the sensor structure 201 in the sheath tube 202 by a predetermined amount a predetermined number of times while making a single rotation of the sensor structure 201 at a predetermined speed by the automatic profiler 203. The measuring program is further configured to record measurement results obtained during the operation.

Subsequently, the measurement results are fitted onto perfect circles or a model of solid of revolution by using a method such as a least square method. A center position of a model such as the cylindrical model is used as a virtual center axis of the inner tube 4B, and thereby a difference $DA_i$ between the rotation axis of the rotating shaft body 36 and the virtual center axis of the inner tube 4B at each height position (i) is calculated. In addition, a higher accuracy may be obtained by fitting the measurement results onto a single right circular cylinder model.

In addition, since the main exhaust port 4E or the plurality of the supply slits 4F are installed at the inner tube 4B when fitting the measurement results, the laser (emitted light) may reach the outer tube 4A by passing through the main exhaust port 4E or the plurality of the supply slits 4F. Thereby, measured values may be different from the actual distance to the inner tube 4B. Therefore, such outliers, as well as measured values from locations close to where the outliers are obtained, are excluded in fitting the measurement results.

In addition, when there is a concern that the sheath tube 202 adversely affects the coherence of the laser, a plurality of openings are provided on a side surface of the sheath tube 202 at predetermined intervals and the shape measuring apparatus measures the shape of the reaction tube 4 through the plurality of the openings. Alternatively, an opening is provided in the vicinity of a front end (tip) of the sheath tube 202, the 45° rod mirror 84 is fixed in the opening, and a gap between the sheath tube 202 and the 45° rod mirror 84 is sealed. In the latter case, the sheath tube 202 is rotated and moved up and down by the automatic profiler 203 when measuring the shape of the reaction tube 4.

Figure 8:
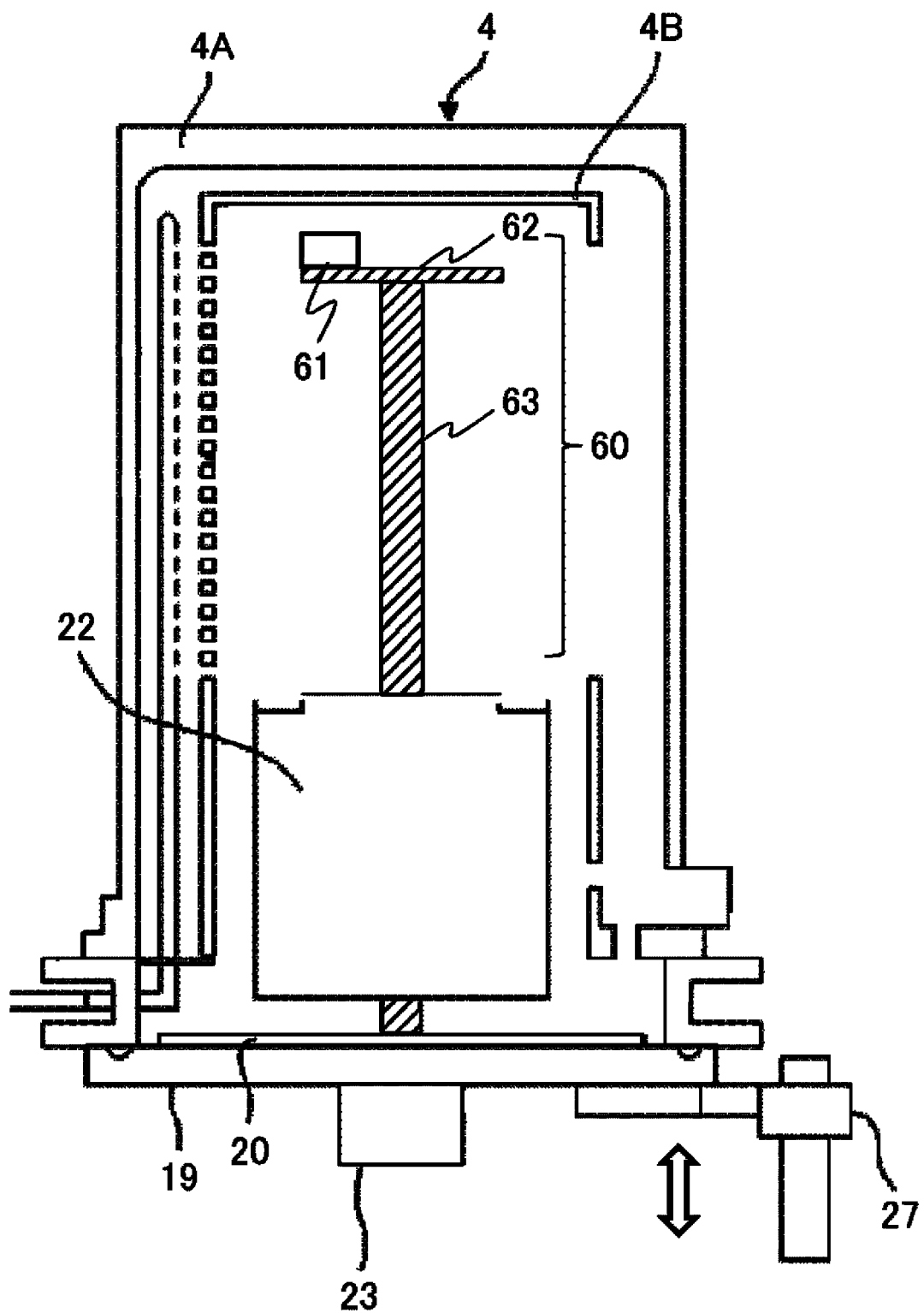
FIG. 8 is a diagram schematically illustrating another configuration example of the shape measuring apparatus configured to measure the shape of the reaction tube preferably used in the embodiments described herein.

FIG. 8 schematically illustrates another configuration example of the shape measuring apparatus configured to measure the shape of the reaction tube 4 (that is, the inner tube 4B) preferably used in the present embodiment. In the shape measuring apparatus shown in FIG. 6, the sensor structure 201 is rotated by the automatic profiler 203 to measure the shape of the reaction tube 4. On the other hand, in the configuration example of the shape measuring apparatus shown in FIG. 8, the shape of the reaction tube 4 (that is, the inner tube 4B) is measured by rotating and moving up and down a sensor jig 60 by using the rotator 23 and the boat elevator 27 of the substrate processing apparatus 100. During a normal use, the inner shaft 23B is fixed to the casing 23A so that it cannot rotate. Therefore, the fixing block (which is a fall-out prevention tool) 23Q configured to non-rotatably fix the inner shaft 23B is removed, and the inner shaft 23B and the outer shaft 23C are connected by using a connector. By rotating the outer shaft 23C with the inner shaft 23B and the outer shaft 23C connected, the inner shaft 23B is rotated. Thereby, the inner shaft 23B can be rotated without additionally preparing a motor configured to rotate the inner shaft 23B.

The sensor jig 60 includes a sensor head 61, a support plate 62 on which the sensor head 61 is mounted and a measurement support column 63. The support plate 62 is of a disk shape, and the measurement support column 63 is connected to a center of the support plate 62. For example, the measurement support column 63 may be constituted by a pipe made of stainless steel, and a diameter of the measurement support column 63 is substantially the same as the outer diameter of the sub heater support column 33 or an inner diameter of the inner shaft 23B. The measurement support column 63 is inserted into the opening of the inner shaft 23B instead of the sub heater support column 33 in a manner of a clearance fit, and is fixed by the vacuum joint 23P or a stronger fixing tool used instead of the vacuum joint 23P. Alternatively, the sensor head 61 may be directly attached to an upper end portion of the measurement support column 63 without providing the support plate 62. In either case, an upper end of the sensor head 61 is arranged so as to be almost at the same height as the upper end of the boat 21 when the boat elevator 27, with the heat insulating assembly 22 and the boat 21 mounted thereon, is elevated to an uppermost position.

The sensor head 61 may be constituted by a triangulation type laser range finder (displacement meter) commonly used in industrial applications. For example, the sensor head 61 emits a laser beam, detects an angle of a reflected light (a regularly reflected light) from a measured object received by a light receiver, and outputs an electrical signal indicating a calculated distance through a serial interface. It is sufficient that a distance range measured by the sensor head 61 is about 10 cm to 20 cm. A cable from the sensor head 61 appropriately passes through the measurement support column 63 and is connected to the I/O port 218 (refer to FIG. 6) or a component such as an external computer.

For example, optical paths of the emitted light and an incident light of the sensor head 61 may be of a geometry that is substantially symmetrical with respect to a certain radial line (perpendicular to the rotating shaft) in a horizontal plane (which is vertical to the rotating shaft), or may be of a geometry that is almost symmetrical with respect to a horizontal plane in the same plane as the rotating shaft. In another example, the optical paths of the emitted light and the incident light of the sensor head 61 may be of a geometry that at least one among the emitted light and the incident light coincides with the radial line.

When the setup of the shape measuring apparatus is completed, the controller 29 executes a measuring program. Since the shape measuring apparatus uses the components of the substrate processing apparatus 100, it is preferable to execute the measuring program by the controller 29. However, the external computer may be used to execute the measuring program. It is assumed that the boat elevator 27 is initially at an unloading position (which is lower than the loading position). The measuring program is configured to perform an operation of elevating the boat elevator 27 by a predetermined amount a predetermined number of times while making a single rotation of the rotating shaft body 36 at a predetermined speed. The measuring program is further configured to record measurement results obtained by the sensor head 61 during performing the operation. Alternatively, the sensor head 61 may be spirally elevated. When the sensor head 61 is spirally elevated, in order to prevent the arm of the boat elevator 27 from bending or vibrating, the boat elevator 27 may be elevated or lowered smoothly.

Subsequently, the CPU 212 of the controller 29 performs a fitting operation similar to that of the shape measuring apparatus shown in FIG. 6 based on the measurement results. As a result, the difference $DA_i$ between the rotation axis of the rotating shaft body 36 and the virtual center axis of the inner tube 4B at each height position (i) is calculated.

The shape of the inner tube 4B can be measured by using the laser beam. However, the present embodiment is not limited thereto. For example, a magnetic linear scale may be used to measure the shape of the inner tube 4B. For example, the magnetic linear scale may include two components, one of which is configured as a magnet of generating a predetermined regular magnetic pattern in the measurement support column 63, and the other of which is configured as a magnetic sensor on the vacuum joint 23P. The vacuum joint 23P supports the measurement support column 63 with such strength that it is possible to elevate or lower the measurement support column 63 by manual force without dropping the measurement support column 63 due to its own weight.

In addition, when the opening 39A is provided at the cylinder structure 39 (refer to FIG. 2B), the sensor jig 60 shown in FIG. 8 is attached to the inner shaft 23B with the boat 21 and the heat insulating assembly 22 installed, and the sensor jig 60 is made to operate as the shape measuring apparatus. Thereby, it is possible to rotate the sensor jig 60 relative to the boat 21 and to measure the shape of the boat 21 based on the rotating shaft as a reference axis. Thus, it is possible to measure a center position of the boat 21 or a possible range for each wafer to be inserted based on a position of a column of the boat 21.

Using the difference $DA_i$ between the rotation axis of the rotating shaft body 36 and the virtual center axis of the inner tube 4B at each height position (i) of the reaction tube 4 obtained by measuring the shape of the inner tube 4B as described above, a method of optimizing a position of inserting the wafer into the boat 21 by the wafer transport device 125 will be described.

FIG. 9 is a flowchart schematically illustrating a process flow of calculating a wafer transfer position preferably used in the present embodiment. The method of the flowchart shown in FIG. 9 may be preferably applied when the rotation axis of the rotating shaft body 36 and the center axis of the boat 21 are relatively well matched, and the wafer 7 is deviated from an optimum insertion position due to problems of accuracy in boat manufacturing or automatic teaching.

As a prerequisite, the difference $DA_i$ between the rotation axis of the rotating shaft body 36 and the virtual center axis of the inner tube 4B at each height position (i) of the reaction tube 4, obtained by measuring the shape of the inner tube 4B as described above, is stored in the memory 216 of the controller 29 (step S70).

First, with the boat 21 unloaded out of the reaction tube 4, transfer position coordinates $P0_i$ at which the plurality of the wafers including the wafer 7 can be safely inserted into the boat 21 are grasped by a method similar to a conventional method (step S71). Specifically, the transfer position coordinates $P0_i$ are coordinates of a center position of each wafer when the plurality of the wafers are placed by a transfer robot 125a such that each wafer is on the center axis of the boat 21. The boat 21 includes three columns installed in the vertical direction, and the plurality of the wafers are inserted into a plurality of grooves in provided in the columns, respectively. While the boat 21 is stopped at a rotational position (transfer position) by the controller 29 such that a central one of the three columns of the boat 21 is located farthest from the transfer robot 125a of the wafer transport device 125, the shape of the reaction tube 4 is measured (the automatic teaching operation) using a sensor attached to the transfer robot 125a. The automatic teaching also can be carried out at some rotational positions of the boat 21 using a wafer-like jig with a measurement target on the center of the disk by remotely measuring the position of the target. As a result, the transfer position coordinates $P0_i$ are measured at each height position i in consideration of such factors as the difference between apparatuses in the height position where the plurality of the wafers are accommodated in the boat 21 and a deviation in horizontal position due to an inclination of the boat 21. The number of wafers measured by a single measurement may correspond to the number of wafers transferred by a single operation of the transfer robot 125a. When the transfer position coordinates $P0_i$ are measured, it is desirable to find out beforehand a vertical and horizontal range $M_i$ to be reached from the transfer position coordinates $P0_i$ (center axis of the boat 21) where the wafer can be inserted with a safety factor equal to or higher than a predetermined level (or a wafer damage rate equal to or lower than a predetermined level). The vertical and horizontal range $M_i$ may be determined based on a width and a depth of each of the grooves engraved on the columns of the boat 21 where each of the wafers is inserted.

Subsequently, a position (or position coordinates) PR of the rotation axis of the rotating shaft in a coordinate system of the transfer robot 125a is determined (step S72). When it is determined that the boat 21 is not inclined (that is, the inclination of the boat 21 can be ignored), the position PR of the rotation axis may be obtained by fitting the transfer position coordinates $P0_i$ obtained in the step S71 onto an arbitrary vertical line. On the other hand, when the inclination of the boat 21 is considered, the result of the measurement (automatic teaching operation) in the step S71 is fitted onto a cylinder for each batch of wafers transferred by a single operation of the transfer robot 125a, and coordinates of a center axis of the cylinder are set as a position $PR_i$. The latter way is an implementation of the fitting to a solid of revolution.

Subsequently, in consideration of the deviation between the rotating shaft and the virtual center axis of the inner tube 4B, transfer position coordinates $P1_i$ at which the transfer robot 125a actually transfers each of the wafers are determined (step S73). According to the present embodiment, in the coordinate system of the transfer robot 125a, an extending direction of the rotating shaft is defined as a Z-axis direction, and an X-axis direction and a Y-axis direction are defined in a plane perpendicular to the Z-axis direction. First, X-axis and Y-axis components of the position PR (or $PR_i$) of the rotating shaft obtained in the step S72 are added with X-axis and Y-axis components of the difference $DA_i$ at the height position, respectively, to obtain temporary transfer position coordinates $P1_i'$. When a coordinate system in which the difference $DA_i$ is defined is different from the coordinate system of the transfer robot 125a, the temporary transfer position coordinates $P1_i'$ are converted into the coordinate system of the transfer robot 125a. When the temporary transfer position coordinates $P1_i'$ for each of the wafers are all within the allowable range $M_i$ obtained in the step S71, the temporary transfer position coordinates $P1_i'$ are determined as the transfer position coordinates $P1_i$. On the other hand, even when there is one temporary transfer position coordinate outside the allowable range $M_i$, the transfer position coordinates $P1_i$ that fall within the allowable range $M_i$ are calculated with respect to the temporary transfer position coordinates $P1_i'$. For example, using $\alpha$ ($0<\alpha<1$) as a variable and an equation $P1_i=\alpha P1_i'+(1-\alpha)P0_i$, the transfer position coordinates $P1_i$ between the center axis of the boat 21 and the virtual center axis of the inner tube 4B of the reaction tube 4 that fall within the allowable range $M_i$ are obtained while changing the value of $\alpha$. When the transfer position coordinates $P1_i$ within the allowable range $M_i$ at every height position are obtained, the process flow shown in FIG. 9 is completed.

In addition to the process flow described above, the position of the rotation axis of the rotating shaft body 36 at each height position may be measured by the transfer robot 125a. In this case, even when the deviation occurs between the rotation axis of the rotating shaft body 36 and the center axis of the boat 21, it is possible to transfer the plurality of the wafers by reflecting the measurement results obtained by the shape measuring apparatus with a high accuracy. A process flow in this case will be described by focusing on differences from the process flow shown in FIG. 9.

According to the process flow of the above case, position coordinates of the shape measuring apparatus (specifically, the sheath tube 202 (refer to FIG. 6)) and the measurement support column 63 (refer to FIG. 8) are detected by the sensor mounted on the transfer robot 125a before or after the shape measuring apparatus measures the shape (hereinafter, the sheath tube 202 and the measurement support column 63 may also be referred to as a "sheath tube and the like"). The transfer robot 125a searches for the closest position on a cylindrical surface of the sheath tube and the like from its own sensor (which is usually provided on a horizontal line connecting an installation position or a turning position of the transfer robot 125a with the rotating shaft), and measures its position and distance. This measurement is performed at two or more points of different heights. Since it is expected that an axis of the sheath tube and the like is sufficiently coincident with the rotating shaft, the measurement need not be performed a plurality of times by rotating the sheath tube and the like. However, in order to improve the accuracy, the measurement may be performed by rotating the sheath tube and the like by, e.g., 120 degrees three times (that is, by varying a rotation angle of the boat 21), and the measurement results of the three times may be averaged.

Subsequently, the process flow shown in FIG. 9 is performed. When performing the contents of step S72, the position $PR_i$ of the rotating shaft in the coordinate system of the transfer robot 125a is determined by interpolating or fitting the measurement results of two or more points at different heights of the sheath tube and the like measured by the transfer robot 125a.

According to the process flow described above, the position coordinates of the rotating shaft are measured by the transfer robot 125a. However, it is also possible for the shape measuring apparatus to measure (automatic teaching) the shape of the boat 21 for transfer. As described above, by measuring the shape of the boat 21 with the boat 21 and the heat insulating assembly 22 installed, it is possible to measure the shape of the boat 21 based on the rotating shaft as a reference axis. Therefore, the shape measuring apparatus may collectively measure (automatic teaching) the shape of the boat 21 and the shape of the inner tube 4B based on the rotating shaft as the reference (that is, in a rotating shaft coordinate system). Subsequently, the position coordinates of the rotating shaft are measured by the sensor of the transfer robot 125a in the coordinate system of the transfer robot 125a, and the results measured by the shape measuring apparatus are converted from the rotating shaft coordinate system to the coordinate system of the transfer robot 125a. The transfer position coordinates $P1_i$ are obtained using these converted measurement results.

According to the present embodiment, it is possible to align the wafer at a more preferable position from a viewpoint of the uniformity of the film-forming process in the substrate processing apparatus installed in a semiconductor device manufacturing plant or the like in which heat run tests have been carried out.

Other Embodiments

While the technique is described in detail by way of the above-described embodiment, the above-described technique is not limited thereto. The above-described technique may be modified in various ways without departing from the scope thereof.

As described above, according to some embodiments in the present disclosure, it is possible to provide the substrate processing apparatus capable of improving the process uniformity.

What is claimed is:
1. A substrate processing apparatus comprising:
a boat on which substrates are placed;
a process furnace comprising a reaction tube into which the boat is to be inserted and a rotator configured to rotate the boat by placing the boat on a rotating shaft when the boat is inserted in the reaction tube, wherein a film is formed on the substrates placed on the boat in the reaction tube;
a substrate transport device configured to transfer the substrates into the boat; and
a controller configured to control the substrate transport device, wherein the controller is further configured to store information on a difference between a rotation axis of the rotating shaft and a virtual center axis of the reaction tube measured in advance so that the substrates are transferred into the boat by the substrate transport device referring to the virtual center axis.

2. The substrate processing apparatus of claim 1, wherein the controller is further configured to control the substrate transport device such that a center position of each of the substrates transferred into the boat by the substrate transport device is located between a center axis of the boat and the virtual center axis of the reaction tube, and the center position falls within a range from the center axis of the boat wherein a safety factor equal to or higher than a predetermined level is satisfied in the range.

3. The substrate processing apparatus of claim 1, wherein the controller is further configured to obtain transfer position coordinates P0 for each of the substrates to be safely inserted into the boat.

4. The substrate processing apparatus of claim 3, wherein the controller is further configured to use, as a geometric information of the rotation axis, a result of fitting the transfer position coordinates P0 obtained for a part of the substrates onto a straight line or a solid of revolution.

5. The substrate processing apparatus of claim 3, wherein the controller is further configured to calculate the transfer position coordinates P0 based on a detection result of a sensor attached to the substrate transport device.

6. The substrate processing apparatus of claim 4, wherein the controller is further configured to obtain the transfer position coordinates P0 at least three times by changing rotation angle of the boat and to fit the transfer position coordinates P0 onto the solid of revolution.

7. The substrate processing apparatus of claim 2, wherein the controller is further configured to control the substrate transport device, when the center position falls within the range from the center axis of the boat wherein the safety factor equal to or higher than the predetermined level is satisfied in the range, such that the center position of each of the substrates transferred into the boat by the substrate transport device is located at the virtual center axis of the reaction tube.

8. The substrate processing apparatus of claim 1, wherein the reaction tube is embodied by a double tube structure comprising an outer tube and an inner tube, and
wherein the virtual center axis of the reaction tube is obtained by measuring a shape of an inner surface of the inner tube based on the rotating shaft of a rotating shaft body as a reference axis.

9. The substrate processing apparatus of claim 2, wherein the reaction tube is embodied by a double tube structure comprising an outer tube and an inner tube, and
   wherein the virtual center axis of the reaction tube is obtained by measuring a shape of an inner surface of the inner tube based on the rotating shaft of a rotating shaft body as a reference axis.

10. The substrate processing apparatus of claim 1, wherein a rotating shaft body is provided with an opening configured to communicate with an inside and an outside of the reaction tube and provided coaxially with the rotating shaft of the rotating shaft body,
    wherein the controller is further configured to use the virtual center axis of the reaction tube determined based on data from a sensor inserted through the opening and configured to obtain a shape of an inner surface of the reaction tube.

11. A method of manufacturing a semiconductor device comprising:
    (a) transferring substrates into a boat by a substrate transport device based on a virtual center axis of a reaction tube as a reference axis wherein the boat is to be inserted into the reaction tube;
    (b) inserting the boat into the reaction tube by a boat elevator; and
    (c) processing the substrates by supplying a gas into the reaction tube while rotating the boat around a rotating axis,
    wherein, in the (a), a controller that stores information on a difference between the rotating axis and the virtual center axis measured in advance controls the substrate transport device.

* * * * *